United States Patent
Muhammad et al.

(10) Patent No.: US 7,057,540 B2
(45) Date of Patent: Jun. 6, 2006

(54) SIGMA-DELTA (ΣΔ) ANALOG-TO-DIGITAL CONVERTER (ADC) STRUCTURE INCORPORATING A DIRECT SAMPLING MIXER

(75) Inventors: Khurram Muhammad, Dallas, TX (US); Robert B. Staszewski, Garland, TX (US); Feng Chen, Plano, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/273,217

(22) Filed: Oct. 17, 2002

(65) Prior Publication Data

US 2003/0080888 A1    May 1, 2003

Related U.S. Application Data

(60) Provisional application No. 60/348,902, filed on Oct. 26, 2001.

(51) Int. Cl.
*H03M 3/00*    (2006.01)
(52) U.S. Cl. .................. 341/143; 341/155
(58) Field of Classification Search .......... 341/143, 341/155, 144, 139
See application file for complete search history.

(56) References Cited

U.S. PATENT DOCUMENTS

| | | | |
|---|---|---|---|
| 5,039,989 A | 8/1991 | Welland et al. | 341/143 |
| 5,068,660 A * | 11/1991 | Swanson et al. | 341/143 |
| 5,079,550 A * | 1/1992 | Sooch et al. | 341/143 |
| 5,640,698 A * | 6/1997 | Shen et al. | 455/323 |
| 5,691,720 A * | 11/1997 | Wang et al. | 341/143 |
| 6,037,887 A * | 3/2000 | Wu et al. | 341/143 |
| 6,040,793 A | 3/2000 | Ferguson, Jr. et al. | 341/143 |
| 6,064,871 A | 5/2000 | Leung | 455/223 |
| 6,218,972 B1 * | 4/2001 | Groshong | 341/143 |
| 6,498,819 B1 * | 12/2002 | Martin | 375/345 |
| 6,584,157 B1 * | 6/2003 | Van Der Zwan et al. | 375/247 |
| 6,661,362 B1 * | 12/2003 | Brooks | 341/143 |

\* cited by examiner

*Primary Examiner*—Peguy JeanPierre
(74) *Attorney, Agent, or Firm*—Ronald O. Neerings; Wade James Brady, III; Frederick J. Telecky, Jr.

(57) ABSTRACT

A sigma-delta analog-to-digital converter-offers advantages such as noise shaping and high frequency operation. However, a sampling circuit needed to provide a highly oversampled discrete-time sample stream with low noise characteristics is difficult to design and implement. The present invention provides a sigma-delta mixer 300 with such a sampling circuit 310. The present invention discloses a sampling circuit using switched capacitors 307, 308, and 309 with low noise characteristics and at the same time is capable of providing a highly oversampled discrete-time sample stream.

45 Claims, 5 Drawing Sheets

SIGMA-DELTA (ΣΔ) ANALOG-TO-DIGITAL CONVERTER (ADC) STRUCTURE INCORPORATING A DIRECT SAMPLING MIXER

This application claims priority to provisional application Ser. No. 60/348,902, filed Nov. 26, 2001. The provisional application is incorporated herein by reference as if the application was reproduced in its entirety herein.

FIELD OF THE INVENTION

This invention relates generally to wireless communications systems and particularly to implementing an oversampling sigma-delta ADC structure within a receiver that incorporates a direct sampling mixer.

BACKGROUND OF THE INVENTION

Analog-to-digital converters (ADC) are used to convert analog signals into a digital representation of the same signal. ADCs are used in a wide variety of applications, ranging from medical and entertainment to communications (both voice and data). There are two main types of ADCs, pulse-code modulated (PCM) ADCs and sigma-delta ADCs. PCM ADCs work by periodically sampling the signal to be converted and then quantizing each of the samples into a digital representation. Therefore, the signal to be converted initially becomes a discrete-time sample stream and then a digital bit stream. Sigma-delta ADCs, on the other hand, typically use single-bit quantizers (although, multi-bit sigma-delta ADCs exist) to convert an error function into a digital bit stream, rather than the signal to be converted. The error function is defined to be the difference between the signal to be converted and an analog version of the quantized output.

Sigma-delta ADCs are commonly used in applications where high resolution with low to moderate conversion rates are required. An advantage of sigma-delta ADCs over PCM ADCs is that the sigma-delta ADCs normally make use of single- or low multi-bit (two, three, or four bit) quantizers, making the precision requirements of the sigma-delta ADC much lower than the PCM ADCs which normally use quantizers with a large number of bits (eight or greater). An additional advantage of sigma-delta ADCs is that they can operate at frequencies that are typically much higher than the bandwidth of the signal they are converting. Operating at a frequency greater than the required frequency is commonly referred to as oversampling and an ADC that is operating at a frequency that is K times greater than the required frequency is referred to as a K-times oversampling ADC.

A difficulty encountered with the use of a typical implementation of a sigma-delta ADC operating at a high oversampling rate is the sampling of the signal to be converted, commonly referred to as an analog signal, so that a discrete-time sample stream with a high oversampling rate can be provided to the actual sigma-delta ADC for actual analog-to-digital conversion. Clock jitter (or variations from the expected clock frequency) is a common problem in sampling circuitry. A discrete-time sample stream with a significant amount of clock jitter, when converted into a digital data stream possesses a significant amount of noise, resulting in decreased performance of the overall system. Additionally, a typical sample-and-hold circuit (a circuit commonly used to provide samples) is prone to having non-deal properties that may place severe compromises on the quality of the sample stream that they provide. The typical sample-and-hold circuit can have problems with gain mismatch and offset, and timing mismatch.

A need has therefore arisen for a sigma-delta ADC with a direct sampling circuit or structure (or more simply, a sigma-delta mixer) that is capable of providing good samples of the analog signal at a very high sampling rate.

SUMMARY OF THE INVENTION

In one aspect, the present invention provides a circuit to provide a discrete-time sample stream, the circuit comprising a switch to regulate the flow of a signal, the switch controlled by a control signal, a history capacitor coupled to the switch, the history capacitor to integrate the signal when the switch permits the flow of the signal, at least two rotating capacitors coupled in a parallel fashion to the history capacitor, the rotating capacitors to integrate the signal and the signal accumulated on the rotating capacitors is read out to produce a sample, and a feedback signal line coupled to the rotating capacitors.

In another aspect, the present invention provides a sigma-delta mixer comprising a signal input, a sampling circuit that operates in a discrete-time charge domain, coupled to the signal input, the sampling circuit containing circuitry to convert a signal provided by the signal input into a discrete-time sample stream (DTSS), a discrete-time processing unit coupled to the sampling unit, the discrete time processing unit containing circuitry to filter the discrete-time sample stream, and a feedback signal line coupled to the discrete-time processing unit and the sampling unit, the feedback signal line to carry information outputted by the discrete-time processing unit to the sampling unit.

The present invention provides a number of advantages. For example, use of a preferred embodiment of the present invention provides a sampling structure capable of providing a quality sample stream without the use of complex amplifiers or other active circuits. The present invention makes use of simple to fabricate capacitors and switches and timing circuitry.

Also, use of a preferred embodiment of the present invention provides a quality sample stream with a high sample rate and only a minimal amount of noise on the sample stream. The low noise levels help to increase the overall performance of the sigma-delta mixer and any digital circuits connected to the sigma-delta mixer.

Additionally, use of a preferred embodiment of the present invention provides a method for providing very highly oversampled and down-converted signal stream to a traditional sigma-delta ADC structure.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

The following discussion focuses on a particular type of radio receiver mixer and its circuitry that is operating in a 2.4 Gigahertz frequency band and is adherent to the Bluetooth technical standards. The Bluetooth technical standard specifies a short-range wireless communications network whose intended purpose is a low-power and low-cost replacement for physical cabling. The Bluetooth technical standard is specified in a document entitled "Specification of the Bluetooth System, Version 1.1, Feb. 22, 2001," which is incorporated herein by reference. While the discussion focuses on Bluetooth radios, the present invention is operable in other frequency bands and other technical standards; therefore, the discussion should not be construed as limiting the present invention to Bluetooth transceivers operating at 2.4 Gigahertz. For example, the present invention also has application in global positioning systems (GPS), low-earth orbit satellite system based communications systems and cellular based communications systems. The cellular based systems may include first, second, and third generation (and beyond) digital phone systems, time-division multiple access (TDMA), code-division multiple access (CDMA), global system for mobile communications (GSM) technology along with other digital communications technologies operating at various carrier frequencies. Additionally, the receiver mixer of the present invention has application in wired receivers as well.

Figure 1:
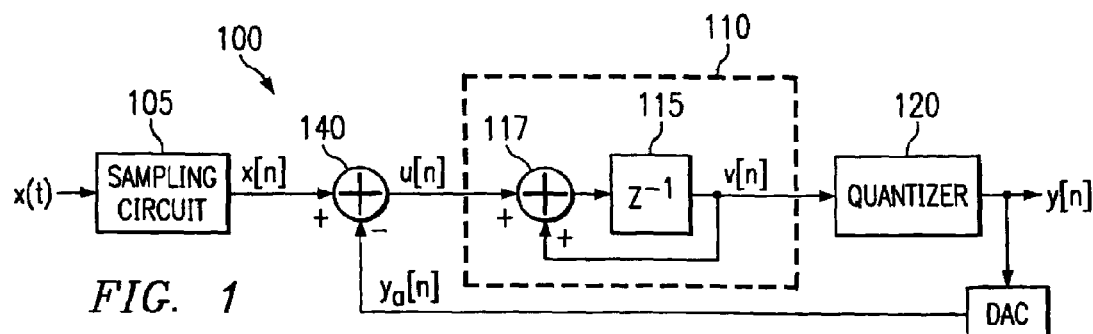
FIG. 1 illustrates a first order sigma-delta analog-to-digital converter (ADC)

Referring now to FIG. 1, a block diagram illustrates a first order sigma-delta ADC 100. Notice that FIG. 1a displays a sigma-delta ADC 100 with a sampling circuit 105. The sampling circuit 105 is typically not considered to be a part of a sigma-delta ADC 100. The sampling circuit 105 provides a discrete-time sample stream, x[n], from a continuous time (analog) signal, x(t). A commonly used sampling technique is a sample and hold circuit, which holds the value of its input signal for a specified amount of time. After the amount of time expires, the track-and-hold circuit holds the current value of its input signal for an additional amount of time. Also note that FIG. 1 labels the names of the signals on the interconnections between functional blocks of the sigma-delta ADC 100. For example, signal x[n] represents a discrete-time sample stream of the analog signal x(t).

In a first initial iteration, the discrete-time sample stream, x[n], is integrated (summed) by a discrete-time integrator 110. In all subsequent iterations, the discrete-time integrator 110 integrates (sums) an error sample stream, u[n]. This is because in the initial iteration, the difference sample stream, $y_a[n]$, is equal to zero. The discrete-time integrator 110 is implemented as a delay block (represented as a delay in the z-domain, $z^{-1}$) 115 and a summing point 117. The output of the discrete-time integrator 110 becomes an input to a quantizer 120. The quantizer 120 is normally a single-bit quantizer, but it is possible to use a multi-bit quantizer. The quantizer 120 takes the output of the discrete-time integrator 110 and converts it into a digital bit value. The output of the quantizer 120, y[n], is also the output of the sigma-delta ADC 100.

In addition to being the output of the sigma-delta ADC 100, the output of the quantizer 120 is also fedback into the summing node 140, through a digital-to-analog converter (DAC) 130. The DAC 130 converts the digital value, y[n], back into an analog value, $y_a[n]$, that is subtracted from the discrete-time sample stream, x[n]. The subtraction is performed at a summing point 140. The operation of a first order sigma-delta ADC is considered well understood by those of ordinary skill in the art of the present invention and will not be discussed further.

Figure 2:
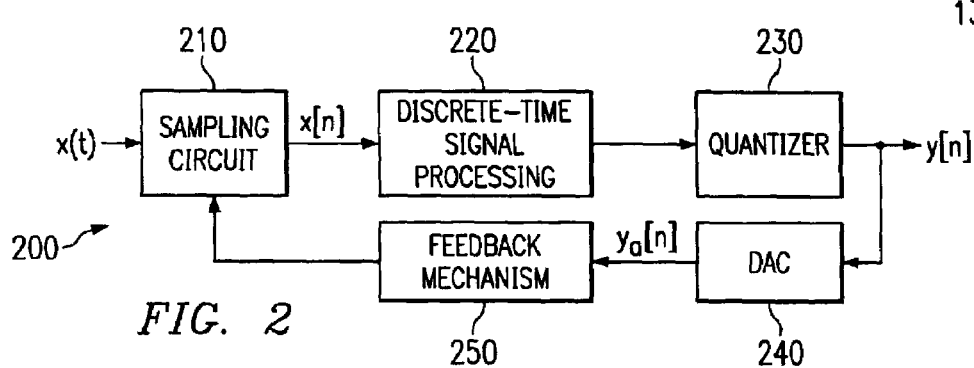
FIG. 2 illustrates a general block diagram of sigma-delta mixer with a switched capacitor sampling circuit performing mixing according to a preferred embodiment of the present invention.

Referring now to FIG. 2, a block diagram illustrates a general block diagram of a sigma-delta mixer 200 with a switched capacitor sampling circuit and the sigma-delta mixer 200 being constructed using switched capacitors according to a preferred embodiment of the present invention. Note that the term "sigma-delta ADC with a mixer" can be used interchangeably with "sigma-delta mixer". A sampling circuit 210 is used to convert a continuous-time analog signal, x(t), into a discrete-time sample stream, x[n]. The discrete-time sample stream, x[n], is then provided to a discrete-time signal processing unit 220, whose function may include gain control and/or filtering. Note that depending upon the filtering performed in the discrete-time signal processing unit 220, the order of the sigma-delta mixer 200 can vary. If the discrete-time signal processing unit 220 performs first order integration, then the sigma-delta mixer 200 behaves similarly to a first order sigma-delta ADC. After being filtered (and possibly gain controlled), the discrete-time sample stream is forwarded to a quantizer 230.

The quantizer 230 may be a single-bit or a multi-bit quantizer. A single-bit quantizer simply converts a sample value into one of two values, typically either a +1 or a −1, depending on the value of the sample. The output of the quantizer 230 is a digital data stream, y[n], and is also the output of the sigma-delta mixer 200. In addition to being the output of the sigma-delta mixer 200, the output of the quantizer 230 is fedback into the sampling circuit 210 for use in generating subsequent outputs of the sigma-delta mixer 200.

The digital data stream, y[n], is fedback into the sigma-delta mixer 200 through a feedback loop. In the feedback loop is a digital-to-analog converter (DAC) 240. The DAC 240 converts the digital data stream, y[n], into a discrete-time sample stream, $y_a[n]$. The discrete-time sample stream is then provided to a feedback mechanism 250 that is used to combine of the discrete-time sample stream, $y_a[n]$, with the discrete-time sample stream of the input signal, x[n]. Since sampling circuit 210 uses switched capacitors, the combination of the two discrete-time sample streams, $y_a[n]$ and x[n], is not accomplished by simply adding (or subtracting) the two discrete-time sample streams.

Figure 3A:
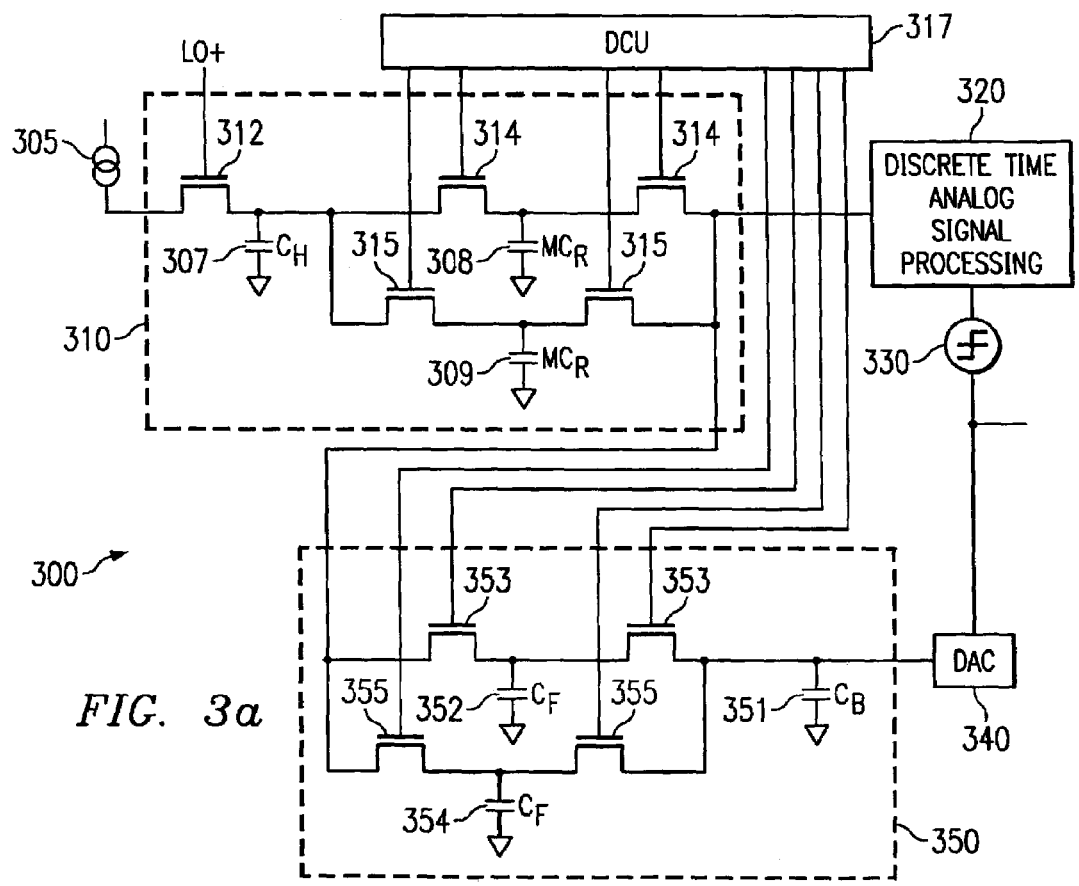
FIGS. 3a–3c illustrate a detailed view of a portion of a first order sigma-delta mixer with a switched capacitor sampling circuit, a detailed view of a switched capacitor sampling circuit, and a high level view of a sigma-delta mixer with multiple signal paths according to a preferred embodiment of the present invention.

Referring now to FIG. 3a, a block diagram illustrates a portion of a first order sigma-delta mixer 300 with switched capacitor sampling and feedback circuits where the mixer/sampling circuit is outside of the feedback loop according to a preferred embodiment of the present invention. FIG. 3a displays a single signal path through a sigma-delta mixer that uses a switched capacitor sampling circuit and a switched capacitor feedback circuit with the sampling circuit not a part of the feedback loop. In many applications, it is common to use differential signaling. In differential signaling, the actual signal is carried on two different signals (and signal lines), one is referred to as a positive signal and the other is a negative signal. Therefore, in order to use the sigma-delta mixer as displayed in FIG. 3a with differential signaling, a second signal path is added. The second signal path is essentially identical to the signal path as displayed and persons of ordinary skill in the art of the present invention can readily see how to extend the sigma-delta mixer of FIG. 3a into a sigma-delta mixer that uses differential signaling.

The sigma-delta mixer 300 includes a transconductance amplifier (TA) 305 that provides a radio frequency (RF) current. According to a preferred embodiment of the present invention, the RF current represents the signal that is to be converted into digital form. The RF current may be brought to the TA 305 by an antenna (not shown) or some other RF source (also not shown). The RF current is then forwarded to a sampling circuit 310. The sampling circuit 310 is implemented using switched capacitors. The use of switched capacitors in a sampling circuit is explored in greater detailed in a co-pending non-provisional patent application entitled "Sampling Mixer with Asynchronous Clock and Signal Domains", filed Apr. 12, 2002, the patent application is incorporated herein by reference.

The RF current is integrated by a history capacitor 307, $C_H$, i.e., a charge is accumulated on the history capacitor 307. The flow of the RF current to the history capacitor 307 is controlled by a switch 312. The switch 312 is preferably coupled to a signal generated by a local oscillator (LO) and closes whenever the signal generated by the LO is positive. The signal is referred to as LO+. Alternatively, the switch 312 is controlled by a signal generated by a digital control unit (DCU) 317. In addition to the history capacitor 307, there are several rotating capacitors 308 and 309 that are also used to integrate the RF current. According to a preferred embodiment of the present invention, each of the rotating capacitors 308 and 309 displayed in FIG. 3a is actually a bank of M (preferably, four) rotating capacitors. FIG. 3a displays the capacitance value of the two rotating capacitors 308 and 309 as $M*C_R$, where $C_R$ is the capacitance of a single rotating capacitor. At any given time, however, only one of the rotating capacitors plus the history capacitor 307 is integrating the RF current. According to a preferred embodiment of the present invention, the ratio of the capacitance of $C_H$ to $C_R$ is greater than or equal to 50.

The control and selection of the particular rotating capacitor used to integrate the RF current is performed by the DCU 317. The DCU 317 controls and selects the rotating capacitors through the use of switches 314 and 315. According to a preferred embodiment of the present invention, when the DCU 317 selects a particular rotating capacitor, it deactivates all of the other rotating capacitors and activates only the chosen rotating capacitors. According to a preferred embodiment of the present invention, the history capacitor 307 integrates the RF current once every RF cycle rather than continuously integrating the RF current. The DCU 317 also controls the history capacitor 307 through the use of the RF switch 312.

After the history capacitor 307 and the rotating capacitors 308 and 309 integrate the RF current for a specified amount of time, the charge accumulated on the rotating capacitors is read out. The read out charge provides a single discrete-time sample of the RF current. According to a preferred embodiment of the present invention, after the charge has been read out from the rotating capacitors, the rotating capacitors are reset and a bias voltage is preset on the rotating capacitors. The use of the rotating capacitors and the charge reset and voltage preset is explored in great detail in another non-provisional patent application entitled "Efficient Charge Transfer Using a Switched Capacitor Resistor", filed May 16, 2002, the patent application is incorporated herein by reference.

By periodically reading out the charge accumulated by the rotating capacitors, the sampling circuit 310 produces a discrete-time sample stream, u[n] (the difference of the discretized input signal, x[n], and the feedback signal, $y_a[n]$ (this is displayed functionally in FIG. 1)). After each discrete-time sample is produced, it is then provided to a discrete-time analog signal processing unit (DTASP) 320. The DTASP 320 can be used to perform gain control and filtering among other operations. According to a preferred embodiment of the present invention, the DTASP 320 is implemented using switched capacitors and buffers. Due to its implementation from switched capacitors and buffers, the DTASP 320 operates via charge sharing in a fashion similar to the sampling circuit 310.

Figure 4:
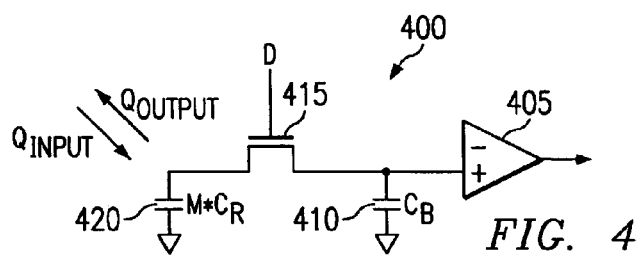
FIG. 4 illustrates a discrete-time analog signal processing unit according to a preferred embodiment of the present invention.

Referring now to FIG. 4, a diagram illustrates the use of an active buffer 405 to realize an infinite-impulse response (IIR) filtering stage 400 in a DTASP 320 according to a preferred embodiment of the present invention. The buffer 405 actually does not play an active role in the IIR filtering operation. Rather, it is used to sense voltage from a buffer capacitor 410, $C_B$, and to present it to the output with a low driving impedance. An RF switch 415 couples the rotating capacitors 420 (displayed here as a single capacitor of value $M*C_R$) to the buffer capacitor 410 during the charge read out phase. As discussed previously, M is the number of rotating capacitors in a single capacitor bank, and in this example, M=4. At the end of the charge read out phase, i.e., the production of the single discrete-time sample, the switch 415 opens, disconnecting the rotating capacitors 420 from the capacitor 410. After being disconnected, the rotating capacitors 420 have their charge reset. It is the resetting of the charge stored on the rotating capacitors that gives rise to the IIR filtering operation. According to a preferred embodiment of the present invention, the IIR filtering operation is of a first order. Should gain control be desired, a gain can be achieved either through active or passive means at the output buffer 405.

Referring back to FIG. 3a, the output of the DTASP 320 is then provided to a quantizer 330. The quantizer 330 is used to convert an analog value (in this case, an analog sample value) into a digital value. For example, if the quantizer 330 is a single bit quantizer, then it compares the analog value against a threshold. If the analog value is below the threshold, then the quantizer 330 would output one specified bit value and if the analog value is greater than or equal to the threshold, the quantizer would output the other bit value. Multi-bit quantizers operate in a similar manner, but they compare the analog value against $2^N-1$ thresholds, where N is the number of bits in the multi-bit quantizer, and produce one of $2^N$ possible bit values as output.

As an alternative to the use of the DTASP 320, a more traditional sigma-delta ADC integrator may be used. The DTASP 320 uses switched capacitors and an output buffer to provide filtering and possibly gain control. The more traditional sigma-delta ADC integrator would attach immediately after the history capacitors 308 and 309 and the switches 314 and 315 and before the quantizer 330. The quantizer 330 may also be similar to one that is usable in a conventional sigma-delta ADC. According to a preferred embodiment of the present invention, there are no special requirements or restrictions placed on the quantizer 330, i.e., an ordinary quantizer could be used.

The output of the quantizer 330, y[n], is the output of the sigma-delta mixer 300. As described previously, the output of the quantizer 330 is also fedback into the sampling circuit 310 for use in the generation of a difference function between it and the input signal. The output of the quantizer 330, y[n], is a digital value and must be converted back into an analog value. This is accomplished via a digital-to-analog converter (DAC) 340. A current-mode DAC would be an example of a DAC usable as the DAC 340. A current-mode DAC produces a certain amount of current, dependant upon the digital value it is receiving as input. In the case of a single bit current-mode DAC, the current-mode DAC operates as a switchable current source. In the case when a multi-bit quantizer is utilized, the DAC 340 can be configured to produce currents of different magnitude, rather than simply switching the current on and off. For example, if a k-bit quantizer were used rather than a single-bit quantizer, then the DAC 340 would produce one of $2^k$ different output values.

The current produced by the DAC 340 is used by a feedback mechanism 350 to subtract the output of the quantizer 330, y[n], from the discrete-time sample stream, x[n]. Since the sampling circuit uses switched capacitors, y[n] cannot be simply subtracted from x[n]. The current produced by the DAC 340 is integrated by a pre-feedback capacitor 351, $C_X$. The integration of the current results in the accumulation of a charge on the pre-feedback capacitor 351. After the pre-feedback capacitor 351 integrates the current for a specified period of time, a pair of switches (353 or 355) is closed by control signals provided by the DCU 317. When the pair of switches is closed, the charge accumulated on the buffer capacitor 351 is shared with one of two feedback capacitors (CF) 352 or 354, depending upon the pair of switches closed. The charge shared with one of the feedback capacitors, $C_F$, is subsequently shared with one of the two rotating capacitors 308 or 309 (again, dependant upon which pair of switches are closed). It is through the charge shared with the rotating capacitors that the output of the quantizer, y[n], is subtracted from the discrete-time sample stream, x[n].

The sampling structure of FIG. 3a, as displayed, samples the RF current only when the signal LO+ is active. Therefore, if left alone, approximately half of the RF current is lost. A similar sampling structure (not shown), referred to as an inverse structure, with a switch that is controlled by an inverse of the LO+ signal (LO−), is used to sample the RF current when the structure as displayed in FIG. 3a is inactive. Combined, the output of the two sampling structures provides a discrete-time sample stream of the complete RF current. According to a preferred embodiment of the present invention, the output of the inverse sampling structure is also provided to the DTASP 320. The DTASP 320 then combines the two discrete-time sample streams into one and uses it in further processing.

Figure 3B:
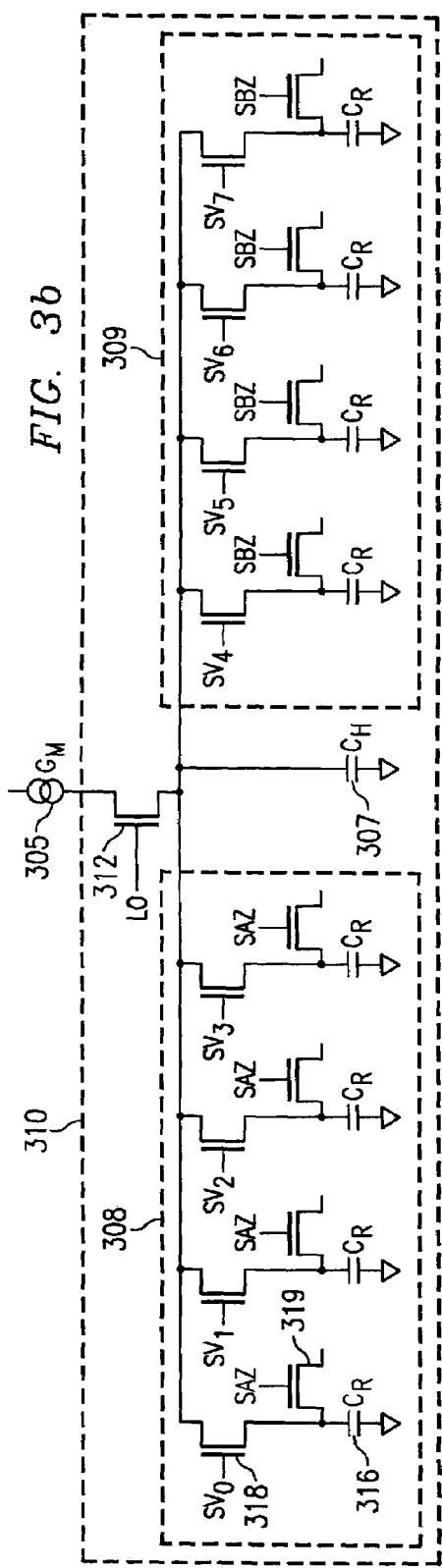

Referring now to FIG. 3b, a diagram illustrates a sampling circuit 310 in greater detail according to a preferred embodiment of the present invention. The sampling circuit 310 as displayed in FIG. 3a had a single merged sampling capacitor with a capacitance of $M^*C_R$, where $C_R$ is defined as the capacitance of a single rotating capacitor and M is the number of rotating capacitors in a single rotating capacitor bank. The purpose of displaying the sampling capacitor as a single merged capacitor is to simplify the diagram. It is actually preferred that the single sampling capacitor be replaces with a plurality of rotating capacitors. FIG. 3b displays a preferred embodiment of the sampling circuit.

FIG. 3b displays only a portion of the sigma-delta mixer 300 displayed in FIG. 3a. The portion of the sigma-delta mixer 300 includes the transconductance amplifier 305 and the sampling circuit 310. The sampling circuit 310 includes the switch 312 that is driven by the signal generated by the local oscillator and the history capacitor 307. The sampling capacitors 308 and 309 are each replaced with a rotating capacitor bank. Each rotating capacitor bank has several rotating capacitors, in this case, there are four rotating capacitors in each rotating capacitor bank.

The sampling capacitor 308 now is a bank of four rotating capacitors, for example, rotating capacitor 316. The switches 314 that are driven by the DCU 317 are replaced by a single switch 318. The switch 318 is also driven by the DCU 317 and is used-to activate-or deactivate the rotating capacitor 316. Another switch 319 is used to read out the charge accumulated on the rotating capacitor. While the sampling circuit displayed in FIG. 3b is a preferred embodiment, use of the sampling circuit displayed in FIG. 3a will result in a fully functional sigma-delta mixer.

According to a preferred embodiment of the present invention, the presence of the buffer capacitor 351 is not necessary for proper operation of the present invention. If the buffer capacitor 351 is not present, then the current provided by the DAC 340 can be directly integrated by either of the feedback capacitors 352 or 354. As displayed in FIG. 3a, the feedback provided could be a two-level feedback (+/−1). This is the realization of a signal bit quantizer. The two-level feedback can be modified to provide multi-level feedback through the addition of additional DAC 340 outputs.

Figure 3C:
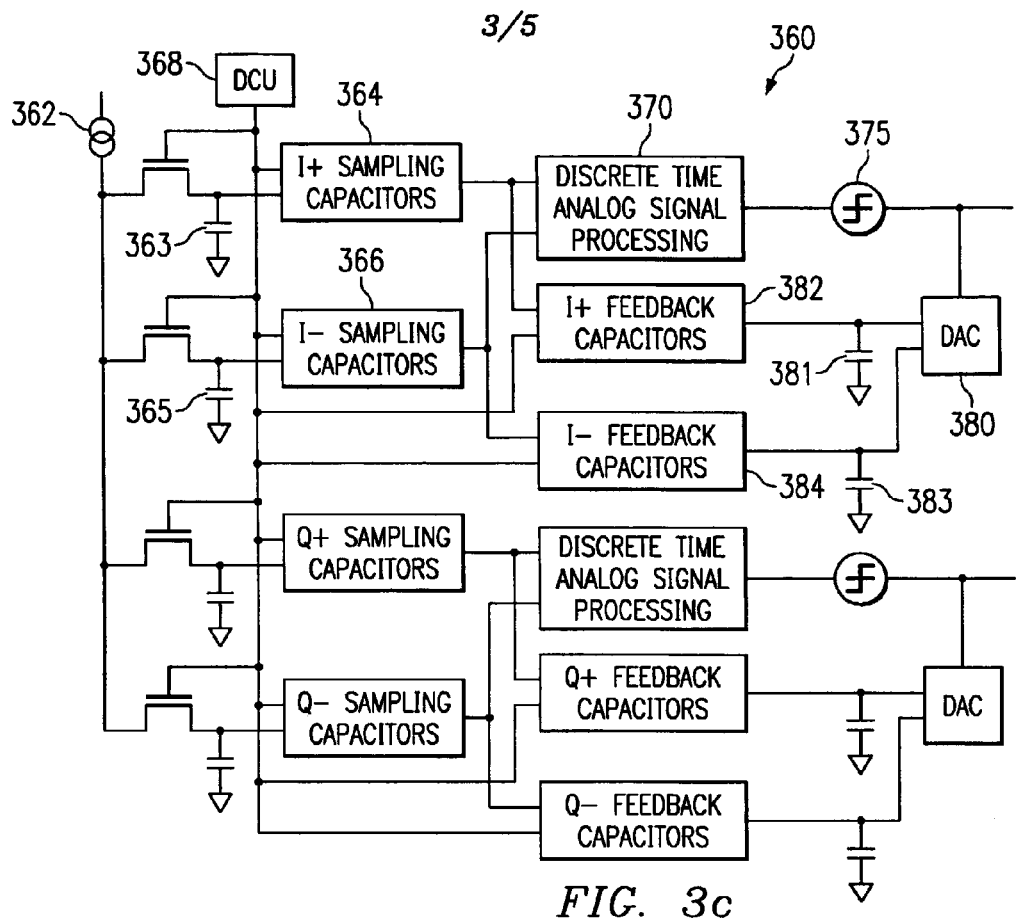

Referring now to FIG. 3c, a block diagram illustrates a sigma-delta mixer 360 with switched capacitor sampling and feedback circuits where the sampling circuit is structurally outside of the feedback loop according to a preferred embodiment of the present invention. While FIG. 3a displays a portion of a sigma-delta mixer, FIG. 3c displays a complete sigma-delta mixer when quadrature-phased, differential mode is being used. The sigma-delta mixer 360 is essentially the same as the sigma-delta mixer 300 with the signal path replicated three additional times.

Note that the sigma-delta mixers presented in FIGS. 3a and 3b are configured so that the sampling circuit is structurally outside of the feedback loop. Alternatively, the sampling circuit can be brought structurally inside the feedback loop.

Figure 5:
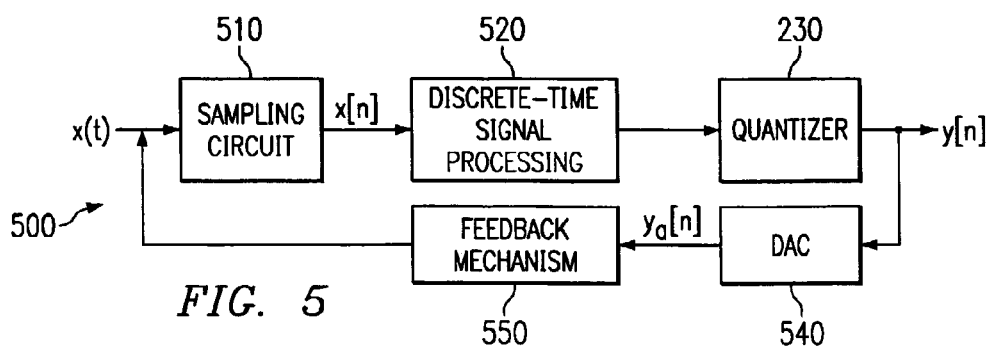
FIG. 5 illustrates an alternative implementation for a sigma-delta mixer with a switched capacitor sampling circuit according to a preferred embodiment of the present invention.

Referring now to FIG. 5, a diagram illustrates a high-level view of a sigma-delta mixer 500 with a switched capacitor sampling and feedback circuits where the sampling circuit is structurally inside the feedback loop according to a preferred embodiment of the present invention. The sigma-delta mixer 500 is similar in design to the sigma-delta mixer displayed in FIG. 2 with the exception of the placement of the feedback loop. Rather than having the feedback be injected structurally after the sampling circuit, such as sampling circuit 210 (FIG. 2), the feedback is injected structurally prior to a sampling circuit, such as sampling circuit 510. Other functional blocks are essentially the same.

Figure 6A:
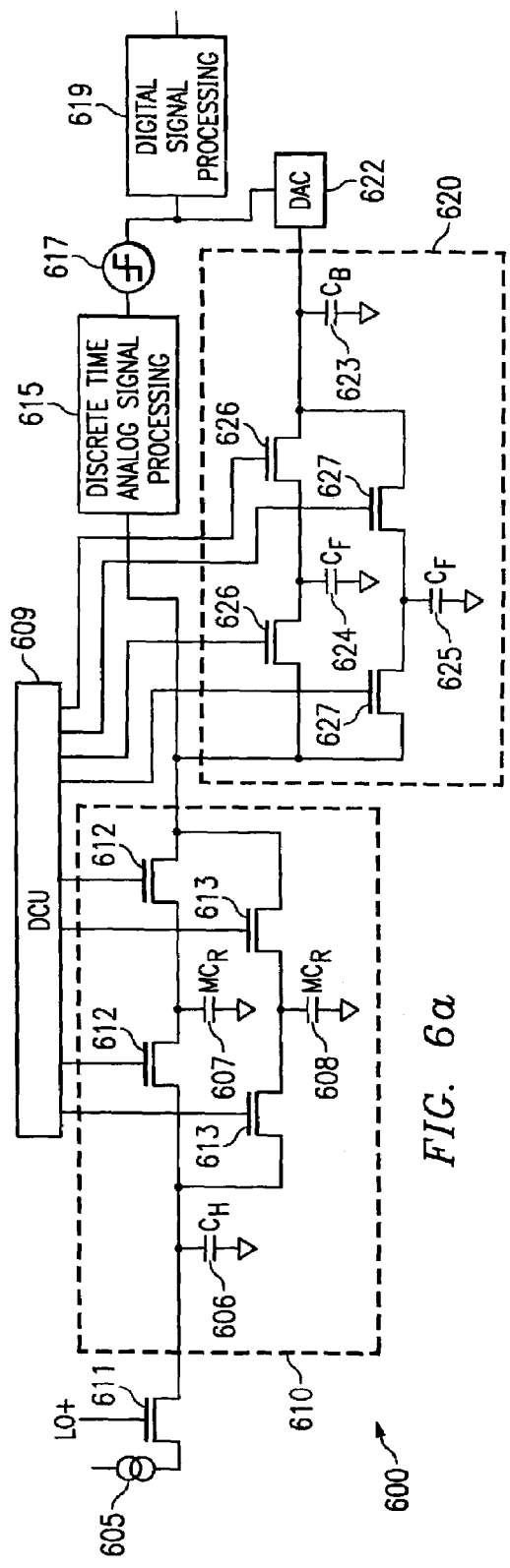
FIGS. 6a and 6b illustrate a detailed view of a portion of a first order sigma-delta mixer with a switched capacitor sampling circuit and a high level view of a sigma-delta mixer with multiple signal paths as displayed in FIG. 5 according to a preferred embodiment of the present invention.

Referring now to FIG. 6a, a block diagram illustrates a portion of a first order sigma-delta mixer 600 with a switched capacitor sampling and feedback circuits where a sampling circuit 610 is structurally inside the feedback loop according to a preferred embodiment of the present invention. As discussed previously in conjunction with FIG. 3a, the sigma-delta mixer 600 displays one signal path out of several required for a sigma-delta mixer 600 that operates with differential signaling.

The sigma-delta mixer 600 includes a transconductance amplifier (TA) 605 that provides a RF current. The RF current is forwarded to the sampling circuit 610 that is responsible for sampling the RF current and providing a discrete-time sample stream representation of the RF current. The flow of the RF current is controlled by a switch 611. According to a preferred embodiment of the present invention, the switch 611 is driven by a signal generated by a local oscillator (LO). Alternatively, the switch 611 can be driven by a signal generated by a digital control unit (DCU) 609. The sampling circuit 610 is created using switched capacitors and a detailed explanation of the operation is provided above. The discrete-time sample stream is provided to a discrete-time analog signal processing unit (DTASP) 615. The DTASP 615 is used to provide gain control and filtering. According to a preferred embodiment of the present invention, the DTASP 615 is configured to provide a first order filtering operation, hence providing the filtering required for a first order sigma-delta ADC.

The output of the DTASP 615 is then converted into a digital data stream by a quantizer 617. Preferably, the quantizer 617 is a single-bit quantizer. The output of the quantizer 617 is provided to a digital signal processing unit (DSP) 619. The DSP 619 is used to provide additional filtering of the output of the quantizer. The output of the DSP 619 is the output of the sigma-delta mixer 600. The output of the quantizer 617 is also used to provide feedback to a point structurally prior to the sampling circuit 610. The output of the quantizer 617 is subtracted from the input signal to provide a difference function that is subsequently converted into a digital bit stream.

The output of the quantizer 617 is converted back into an analog signal by a digital-to-analog converter (DAC) 622. The analog signal is then provided to a feedback mechanism 620. According to a preferred embodiment of the present invention, the sampling circuit 610 uses switched capacitors and therefore, the analog signals provided by the DAC 622 may not be simply subtracted from the input signal. Rather, the DAC 622 produces a current corresponding to the output of the quantizer 617 and the current is integrated by a pre-feedback capacitor 623, $C_X$. After the pre-feedback capacitor 623 integrates the current for a specified period of time, a pair of switches (626 or 627) is closed by control signals provided by the DCU 609. When the pair of switches is closed, the charge accumulated on the pre-feedback capacitor 623 is shared with one of two feedback capacitors ($C_F$) 624 or 625, depending upon the pair of switches closed. The charge shared with one of the feedback capacitors, $C_F$, is subsequently shared with the history capacitor 606, $C_H$. It is through the charge shared with the history capacitor that the output of the quantizer, y[n], is subtracted from the discrete-time-sample-stream, x[n].

According to a preferred embodiment of the present invention, the presence of the pre-feedback capacitor 623 is not necessary for proper operation of the present invention. If the pre-feedback capacitor 623 is not present, then the current provided by the DAC 622 can be directly integrated by either of the feedback capacitors 624 or 625. As displayed in FIG. 6a, the feedback provided may be a two-level feedback (+/−1). This is the realization of a signal bit quantizer. The two-level feedback can be modified to provide multi-level feedback through the addition of additional DAC 622 outputs.

Figure 6B:
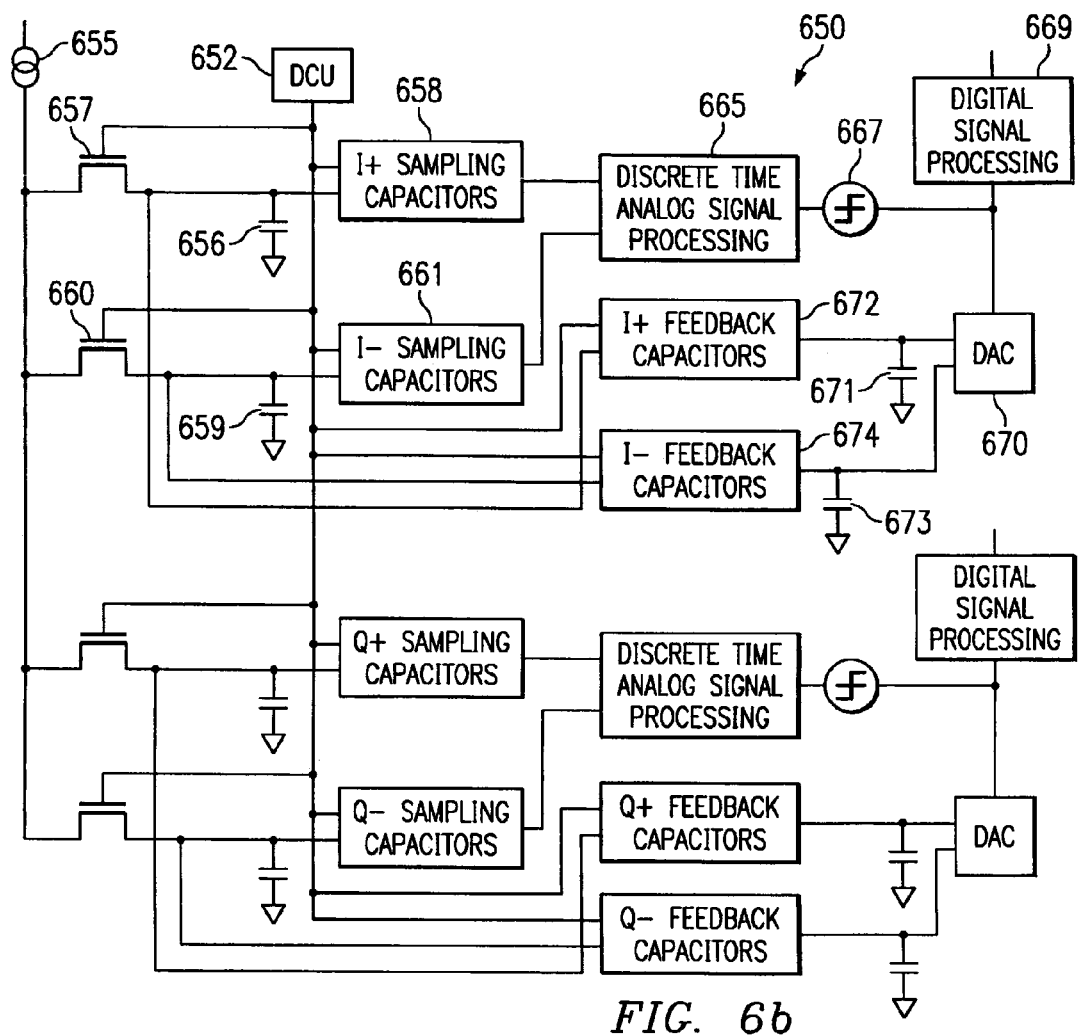

Referring now to FIG. 6b, a block diagram illustrates a sigma-delta mixer 650 with a switched capacitor sampling and feedback circuits where the sampling circuit is structurally inside the feedback loop according to a preferred embodiment of the present invention. While FIG. 6a displays a portion of a sigma-delta ADC, FIG. 6b displays a complete sigma-delta mixer when quadrature-phased, differential signaling is being used. The sigma-delta mixer 650 is essentially the same as the sigma-delta mixer 600 with the signal path replicated three additional times.

FIGS. 3a–b and 6a–b display sigma-delta mixers that use charge sharing to complete the feedback loop. Charge sharing is an efficient way to feed the output of the quantizer, y[n], back to the sampling circuit so that y[n] can be subtracted from the input to provide the-difference function that is then integrated. However, charge sharing is not the only way to accomplish the feedback mechanism. The feedback loop can also be completed using charge injection.

Figure 7:
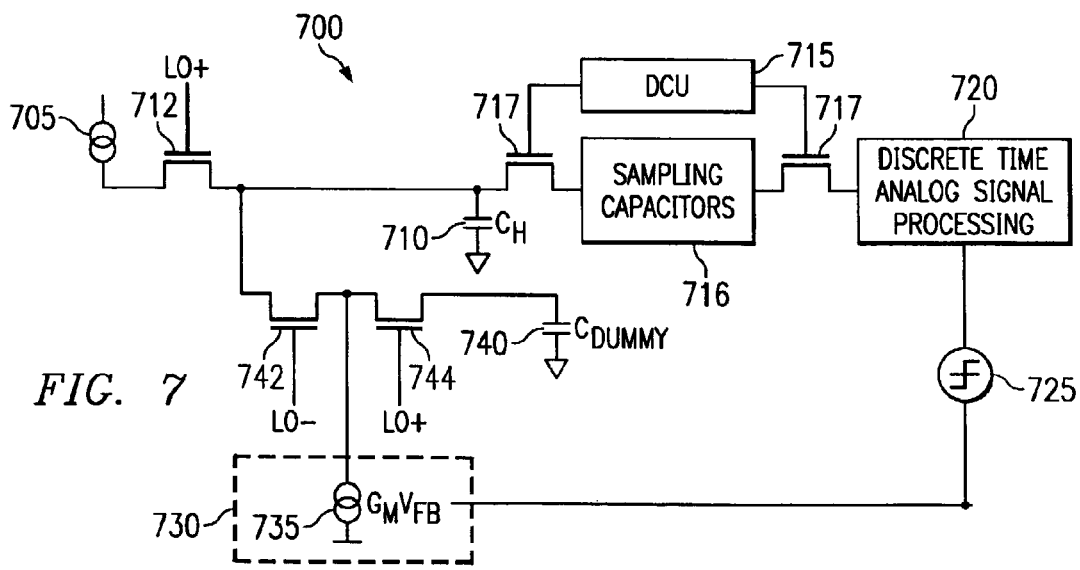
FIG. 7 illustrates a first order sigma-delta mixer with a charge injection feedback mechanism according to a preferred embodiment of the present invention.

Referring now to FIG. 7, a block diagram illustrates a portion of a sigma-delta mixer 700 using charge injection to provide feedback information according to a preferred embodiment of the present invention. The sigma-delta mixer 700 includes a transconductance amplifier (TA) 705 coupled to a history capacitor 710 and sampling capacitors 716. Previously, the sampling capacitors 716 have been referred to as rotating capacitors and typically, there are multiple rotating capacitors arrange in capacitor banks. The sampling capacitors 716 may be multiple banks of rotating capacitors. The task of controlling of the sampling capacitors is performed by a digital control unit (DCU) 715. The history capacitor 710 and the sampling capacitors 716 form a sampling circuit and are used to convert a RF current provided by the TA 705 into a discrete-time sample stream. The flow of the RF current is regulated by a switch 712, which is controlled by a signal generated by a local oscillator (LO), LO+.

The discrete-time sample stream is then provided to a discrete-time analog signal processing unit (DTASP) 720 wherein the discrete-time sample stream may be gain controlled and filtered. The output of the DTASP 720 is provided to a quantizer 725, which converts the discrete-time sample stream into a digital bit stream. The output of the quantizer 725 is the output of the sigma-delta mixer 700. Additionally, the output of the quantizer 725 is used to provide feedback information to the sampling circuit The feedback mechanism as previously described uses charge sharing to combine (subtract) the output of the quantizer 725 from the input signal. The sigma-delta mixer 700 uses charge injection to accomplish a similar result. According to a preferred embodiment of the present invention, the output of the quantizer 725 is provided to a current steering DAC 730. The DAC 730 converts the output of the quantizer 725 into a current of specified magnitude. Preferably, the current produced by the DAC 730 is equal to $gm^*v_{FB}$ where gm is a transconductance gain and $v_{FB}$ is a voltage provided by the output of the quantizer 725.

The current produced by the DAC 730 is directed to the history capacitor 710 by a switch 742. The switch 742 is controlled by an inverse of the signal generated by the LO, LO−, in a fashion similar to the switch 712. When the signal LO− is high, the switch 742 closes and the current produced by the DAC 730 is integrated by the history capacitor 710 and the sampling capacitors 716. The current produced by the DAC 730 is also directed to a dummy capacitor 740 by another switch 744. The switch 744 is driven preferably by the signal generated by the LO, LO+. The signals LO+ and LO− are inverses of one another, i.e., when the signal LO+ is active, the signal LO− is inactive and vice versa. Therefore, the current produced by the DAC 730 is either directed to the history capacitor 710 or to the dummy capacitor 740. As displayed in FIG. 7, the sigma-delta mixer 700 is discarding the output of the quantizer 725 (by integrating the current produced by the DAC 730 with the dummy capacitor 740) when LO+ is active.

Although the output of the quantizer 725 are discarded when LO+ signal is active, the information carried in the current when the LO+ signal is active is not lost since there is preferably a similar structure to that shown in FIG. 7 that discards the output of the quantizer 725 when LO− is active. When combined, the two structures provide (in the form of feedback) all of the output produced by the quantizer 725.

As discussed previously, a first order sigma-delta ADC provides a first order filtering of the signal that it is converting and a second order sigma-delta ADC provides a second order filtering of the signal that it is converting. However, a second order sigma-delta ADC (and higher order ones for that matter) cannot be created by simply cascading first order sigma-delta ADCs.

Figure 8:
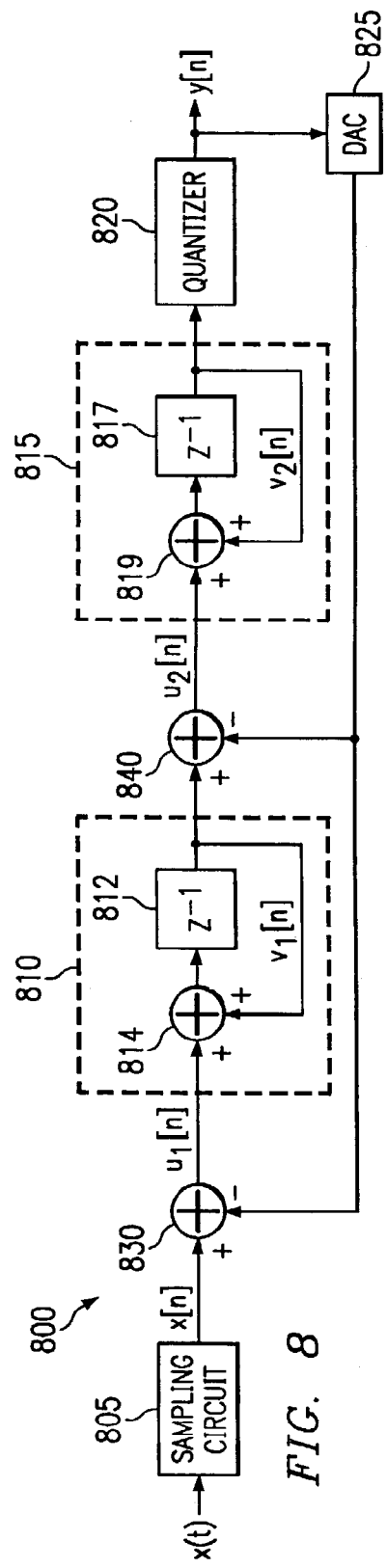
FIG. 8 illustrates a second order sigma-delta ADC.

Referring now to FIG. 8, a block diagram illustrates a second order sigma-delta ADC 800. The order of a sigma-delta ADC refers to the order of the filtering performed by the sigma-delta ADC. For example, the first order sigma-delta ADC 100 illustrated in FIG. 1 has effectively a first order filter that is created in the discrete-time integrator. Therefore, a second order sigma-delta ADC, such as one displayed in FIG. 8 has a behavior that corresponds to a second order filter. Like the discrete-time integrator 110 of the first order sigma-delta ADC 100, the second order sigma-delta ADC 800 has a first discrete-time integrator 815 that provides a first order filter. In addition to the first discrete-time integrator 815, the second order sigma-delta ADC 800 has a second discrete-time integrator 810. It is the second discrete-time integrator 810, in conjunction with the first discrete-time integrator 815 that provides a second first order filter. When cascaded, the two first order filters become a second order filter. By cascading additional filter sections, sigma-delta ADCs of order greater than two can be created.

Figure 9:
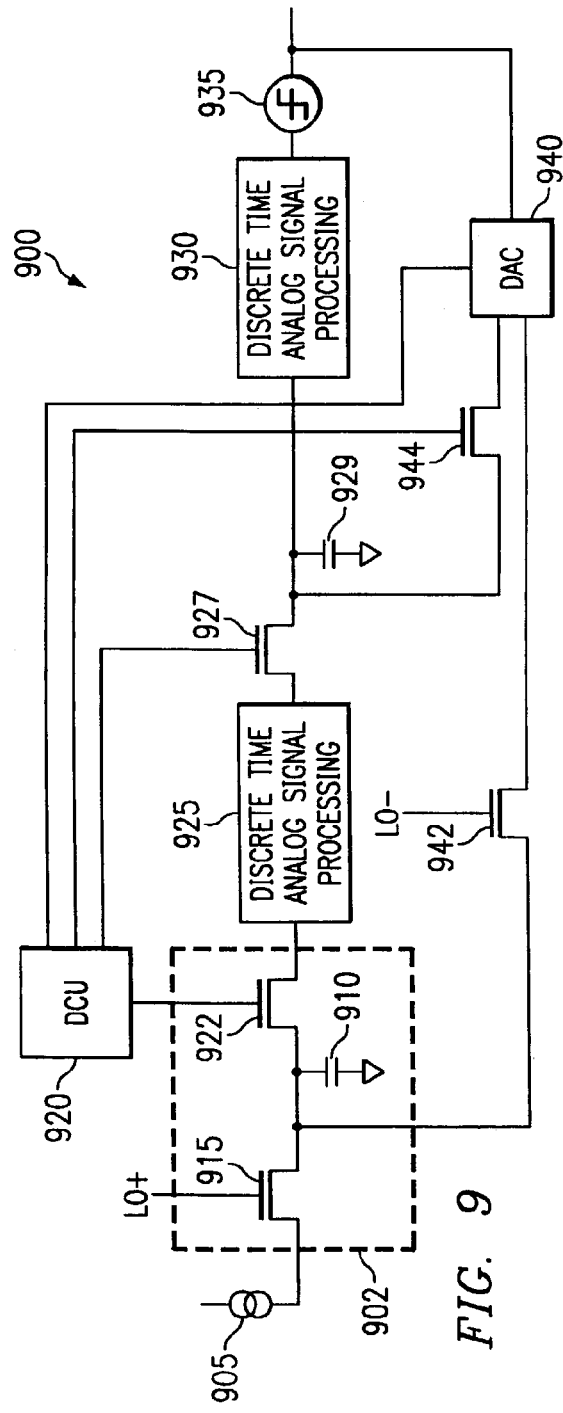
FIG. 9 illustrates a second order sigma-delta mixer with a switched capacitor sampling circuit and feedback mechanisms according to a preferred embodiment of the present invention.

Referring now to FIG. 9, a diagram illustrates a second-order sigma-delta mixer 900 with a switched capacitor sampling circuit 902 according to a preferred embodiment of the present invention. The switched-capacitor sampling circuit 902 is similar to the switched capacitor sampling circuit for the first-order sigma-delta mixer discussed previously. The switched-capacitor sampling circuit 902 includes a sampling capacitor 910 that is controlled by a pair of switches 915 and 922. The first switch 915 regulates the flow of the signal current to the sampling capacitor 910 and is controlled by a signal generated by a local oscillator (LO) and is referred to as LO+. According to a preferred embodiment of the present invention, the switch 915 is active whenever LO+ is active.

Whenever the switch 915 is active, the signal provided by a transconductance amplifier 905 flows and is integrated by the sampling capacitor 910. The second switch 922 is controlled by a digital control unit (DCU) 920. The DCU 920 controls the operation of the sampling capacitor 910. For example, the DCU 920 controls when the charge accumulated on the sampling capacitor 910 is read out, providing a discrete-time sample. According to a preferred embodiment of the present invention, the switched-capacitor sampling circuit 902 can be replaced with one of the previously discussed switched-capacitor sampling circuits wherein the single sampling capacitor 910 is replaced with a history capacitor and several banks of rotating capacitors.

When the switched-capacitor sampling circuit 902 is configured as a combination of a history capacitor and several banks of rotating capacitors, the switched-capacitor sampling circuit 902 performs a filtering operation on the signal provided by the transconductance amplifier 905. This filtering operation is a first-order operation and provides one of the two first-order filtering operations required in a second-order sigma-delta mixer.

The discrete-time sample stream produced by the switched-capacitor sampling circuit 902 is provided to a first discrete-time analog signal processing circuit (DTASP) 925. The DTASP 925 is similar to the DTASP discussed previously in conjunction with first-order sigma-delta mixers. As previously discussed, the DTASP 925 can be configured to provide gain control and filtering. The operation of the DTASP 925 is controlled by signals provided by the DCU 920.

As discussed in FIG. 8, a second-order sigma-delta ADC has two integrators. The DTASP 925 provided one of the two integrators. However, due to the switched capacitor and buffer configuration used for the DTASP and the need to provide feedback information, a second integrator (another DTASP) cannot simply be attached to the output of the first DTASP 925. Rather, a second sampling capacitor 929 is inserted between the first DTASP 925 and a second DTASP 930. According to a preferred embodiment of the present invention, the second sampling capacitor 929 is used to integrate the current provided by the first DTASP 925, which is a discrete-time sample stream. It is the charge accumulated on the second sampling capacitor that is read out and provided to the second DTASP 930. In addition to the output of the first DTASP 925, the second sampling capacitor 929 also accumulates feedback-information. The feedback information and how it is provided to the second-sampling capacitor will be discussed below.

As in the case of the first DTASP 925, the second DTASP 930 can be configured to provide gain control and/or filtering. According to a preferred embodiment of the present invention, the second DTASP 930 is configured to operate as a first-order filter. Therefore, when combined with the first-order filtering provided by the switched-capacitor sampling circuit 902, the necessary filtering of order two is provided. The output of the second DTASP 930 is provided to a quantizer 935. The output of the quantizer 935 is the output of the second-order sigma-delta mixer 900. The operation of the second DTASP 930 is also controlled by the DCU 920.

The output of the quantizer 935 is also used to provide feedback information. As is displayed in FIG. 8, there are two feedback loops in a second-order sigma-delta mixer, one for each integrator. Because the two integrators (previously referred to as DTASPs) use switched capacitors, the feedback information cannot be simply combined with the inputs of the integrators. The feedback information must be combined with the inputs of the integrators through a charge sharing (or charge injection) mechanism as discussed previously. A digital-to-analog converter (DAC) 940 is used to convert the output of the quantizer 935 into a current that is integrated by the sampling capacitors at the inputs of the integrators. The output of the DAC 940 is controlled by switches 942 and 944. The first switch 942 controls the output of the DAC 940 that coupled to the first sampling capacitor 910. The switch 942, itself, is controlled by the inverse of the signal controlling the switch 915. The LO– signal permits the current provided by the DAC 940 to be integrated by the sampling capacitor 910 when the switch 915 prevents the signal provided by the transconductance amplifier 905 from flowing. A second switch 944, controlled by the DCU 920, controls the flow of the current produced by the DAC 940 to the second sampling capacitor 929.

The above discussion focuses on a second-order sigma-delta mixer. However, it should be apparent to persons of ordinary skill in the art of the present invention that third- and higher order sigma-delta mixer can be created by adding additional filtering operations, along with attendant feedback loops.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit to provide a discrete-time sample stream, the circuit comprising:
   a switch to regulate flow of a signal, the switch controlled by a control signal;
   a history capacitor coupled to the switch, the history capacitor to integrate the signal when the switch permits the flow of the signal;
   at least two rotating capacitors coupled in a parallel fashion to the history capacitor, the rotating capacitors to integrate the signal and the signal accumulated on the rotating capacitors is read out to produce a sample; and
   a feedback signal line coupled to the rotating capacitors.

2. The circuit of claim 1, wherein the history capacitor and one of the rotating capacitors is integrating the signal at any given time.

3. The circuit of claim 2, wherein the one of the rotating capacitors integrating the signal rotates between available rotating capacitors in the circuit.

4. The circuit of claim 1, wherein the signal is transmitted over-the-air.

5. The circuit of claim 1, wherein the signal is carried using a wire.

6. The circuit of claim 1, wherein the signal is a radio frequency (RF) current.

7. The circuit of claim 6, wherein the RE current is provided by a transconductance amplifier.

8. The circuit of claim 1, wherein the signal is accumulated on the rotating capacitors as a charge.

9. The circuit of claim 1, wherein each rotating capacitor is a bank of M rotating capacitors, where M is an integer number.

10. The circuit of claim 9, wherein each rotating capacitor is coupled to a switch that regulates the flow of the signal to the rotating capacitor.

11. The circuit of claim 9, wherein only one rotating capacitor in the bank of M rotating capacitors is integrating the signal at any given time.

12. The circuit of claim 9, wherein only one rotating capacitor in the circuit is integrating the signal at any given time.

13. The circuit of claim 1, wherein each rotating capacitor has a capacitance value of $C_R$ and the history capacitor has a capacitance value of $C_H$, and the capacitance value of $C_R$ is much smaller than the capacitance value of $C_H$.

14. The circuit of claim 13, wherein a ratio of $C_H/C_R$ is greater than 50.

15. The circuit of claim 1, wherein each rotating capacitor is controlled by a separate switch coupled to a control signal.

16. The circuit of claim 1, wherein the feedback signal line carries feedback information from a point in an additional circuit coupled to the circuit.

17. The circuit of claim 16, wherein the rotating capacitors integrate the feedback information carried on the feedback signal line.

18. A sigma-delta mixer comprising:
    a signal input;
    a sampling circuit that operates in a discrete-time charge domain, coupled to the input, the sampling circuit containing circuitry to convert a signal provided by the signal input into a discrete-time ample stream (DTSS);
    a discrete-time processing circuit coupled to the sampling circuit, the discrete-time processing circuit containing circuitry to filter the discrete-time sample stream and gain control the discrete-time sample stream;
    a quantizer coupled to the discrete-time processing circuit, the quantizer containing circuitry to digitize the filtered discrete-time sample stream; and
    a feedback signal line coupled to the quantizer and the sampling circuit.

19. A sigma-delta mixer comprising:
    a signal input;
    a sampling circuit that operates in a discrete-time charge domain, coupled to the signal input, the sampling circuit containing circuitry to convert a signal provided by the signal input into a discrete-time sample stream (DTSS);
    a discrete-time analog signal processing unit (DTASP) coupled to the sampling circuit, the DTASP containing circuitry to filter the DTSS;
    a quantizer coupled to the DTASP, the quantizer to convert an output produced by the DTASP into a digital value;
    a feedback signal line coupled to the DTASP and the sampling circuit, the feedback signal line to carry information outputted by the discrete-time processing unit to the sampling unit;
    a digital-to-analog converter (DAC) coupled to the output of the quantizer, the DAC to convert an output of the quantizer into an analog signal; and
    a feedback mechanism coupled to the DAC, having an output coupled to the feedback signal line, the feedback mechanism containing circuitry to convert the analog signal produced by the DAC into a feedback signal that is combined with the input signal.

20. The sigma-delta mixer of claim 19, wherein the feedback signal is combined with the input signal while it is a continuous-time signal.

21. The sigma-delta mixer of claim 19, wherein the feedback signal is combined with the input signal after it has been converted into a DTSS.

22. The sigma-delta mixer of claim 19, wherein the analog signal produced by the DAC is a current.

23. The sigma-delta mixer of claim 22, wherein the current produced by the DAC can become one of two values.

24. The sigma-delta mixer of claim 19, wherein the quantizer is a k-bit quantizer where k is an integer number.

25. The sigma-delta mixer of claim 19, wherein the sampling circuit comprises:
a first switch to regulate the flow of the signal, the first switch controlled by a control signal;
a history capacitor coupled to the switch, the history capacitor to integrate the signal when the first switch permits the flow of the signal; and
at least two rotating capacitors coupled to the first switch and coupled in a parallel fashion to the history capacitor, the rotating capacitors to integrate the signal and the signal accumulated on the rotating capacitors is read out to produce a sample, wherein each rotating capacitor is coupled to a switch that regulates the flow of the signal to the rotating capacitor, the switch regulating each rotating capacitor is controlled by a different control signal.

26. The sigma-delta mixer of claim 19, wherein the DTASP comprises:
a switch coupled to the output of the sampling circuit, the switch to regulate the flow of the output of the sampling circuit;
a buffer capacitor coupled to the switch, the buffer capacitor to integrate the output of the sampling circuit; and
a buffer having a positive input coupled to the buffer capacitor and a negative input coupled to an output of the buffer, the buffer to maintain the input signal.

27. The sigma-delta mixer of claim 26, wherein the switch is closed periodically to permit a charge stored on the sampling circuit to be read out.

28. The sigma-delta mixer of claim 27, wherein after the charge is read out from the sampling capacitors, the sampling capacitors are coupled to electrical ground.

29. The sigma-delta mixer of claim 27, wherein after the sampling capacitors are coupled to electrical ground, a bias voltage is applied onto the sampling capacitors.

30. The sigma-delta mixer of claim 26, wherein the buffer is a continuous time buffer.

31. The sigma-delta mixer of claim 30, wherein the buffer can provide a signal gain of greater than one.

32. The sigma-delta mixer of claim 19, wherein there are at least two sampling capacitors in the sampling circuit, and the feedback mechanism comprises:
a pre-feedback capacitor coupled to the DAC, the pre-feedback capacitor to integrate the current produced by the DAC and accumulate a charge; and
at least two feedback capacitors, one for each sampling capacitor, each feedback capacitor coupled to a switch that is coupled to the pre-feedback capacitor, the feedback capacitor to share the charge on the pre-feedback capacitor when the switch is closed.

33. The sigma-delta mixer of claim 32, wherein only one feedback capacitor is coupled to the pre-feedback capacitor at a time.

34. The sigma-delta mixer of claim 32, wherein each feedback capacitor is coupled to a sampling capacitor.

35. The sigma-delta mixer of claim 19, wherein the feedback mechanism comprises:
a dummy capacitor coupled to a first switch, the dummy capacitor to integrate the current produced by the DAC;
a second switch having an input coupled to the output of the DAC and an output coupled to the sampling circuit, the second switch to regulate the current produced by the DAC;
a first signal line coupled to the first switch, the first signal line to carry a first signal used to control the first switch; and
a second signal line coupled to the second switch, the second signal line to carry a second signal used to control the second switch.

36. The sigma-delta mixer of claim 35, wherein the first signal and the second signal are inverses of one another.

37. The sigma-delta mixer of claim 40, wherein sampling circuit comprises a third switch to regulate the flow of a current, the third switch controlled by a control signal, and the second signal is the same control signal used to control the third switch in the sampling circuit.

38. The sigma-delta mixer of claim 19 further comprising a digital control unit (DCU) coupled to the sampling circuit, the DCU containing circuitry to generate control signals for the sampling circuit.

39. The sigma-delta mixer of claim 38, wherein the DCU is also coupled to the feedback mechanism.

40. The sigma-delta mixer of claim 38, wherein the DCU is also coupled to the DTASP.

41. The sigma-delta mixer of claim 19, wherein the DTASP further contains circuitry to provide gain control for the DTSS.

42. The sigma-delta mixer of claim 19 further comprising:
a second DTASP having an input coupled to the sampling circuit, the second DTASP containing circuitry to filter the DTSS;
a second history capacitor coupled to an output of the second DTASP and an input of the first DTASP, the second history capacitor to integrate the output of the second DTASP; and
a second feedback mechanism having an input coupled to the DAC and an output coupled to the second history capacitor, the second feedback mechanism to convert the current produced by the DAC into a feedback signal that is combined with the output of the second DTASP.

43. The sigma-delta mixer of claim 42 further comprising a switch having an input coupled to the output of the second DTASP and an output coupled to the second history capacitor, the switch to regulate the output of the second DTASP.

44. The sigma-delta mixer of claim 42 further comprising a digital control unit (DCU) coupled to the sampling circuit and to both the DTASP and the second DTASP, the DCU containing circuitry to generate control signals for the sampling circuit.

45. The sigma-delta mixer of claim 19, wherein the discrete-time analog signal unit (DTASP) and the quantizer comprise a discrete-time processing unit.

* * * * *